(12) United States Patent
Morgan

(10) Patent No.: US 6,574,128 B1
(45) Date of Patent: Jun. 3, 2003

(54) MID ARRAY ISOLATE CIRCUIT LAYOUT

(75) Inventor: Donald M. Morgan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 09/651,639

(22) Filed: Aug. 30, 2000

(51) Int. Cl.[7] .............................................. G11C 5/06
(52) U.S. Cl. .......................... 365/72; 365/63; 365/51; 365/230.03; 365/230.04; 365/202
(58) Field of Search ....................... 365/230.03, 230.04, 365/202, 51, 72, 63

(56) References Cited

U.S. PATENT DOCUMENTS

| | | | |
|---|---|---|---|
| 4,636,987 A | * 1/1987 | Norwood et al. ...... | 365/189.02 |
| 4,748,349 A | * 5/1988 | McAlexander, III et al. .... | 365/189.11 |
| 5,245,569 A | 9/1993 | Gonzalez et al. ...... | 365/185.02 |
| 5,265,050 A | * 11/1993 | McLaury ............... | 365/189.01 |
| 5,369,622 A | 11/1994 | McLaury .................... | 365/233 |
| 5,394,172 A | 2/1995 | McLaury .................... | 345/554 |
| 5,594,474 A | 1/1997 | McLaury .................... | 345/545 |

* cited by examiner

Primary Examiner—Andrew Q. Tran
(74) Attorney, Agent, or Firm—Leffert Jay & Polzglaze P.A.

(57) ABSTRACT

A double pitched array includes isolation devices to divide the array into subarrays, using the same space which is used for bit line twists. This addition allows the one-fourth of the bit line pair which will not be used to propagate signals to not be charged during a memory operation.

22 Claims, 12 Drawing Sheets

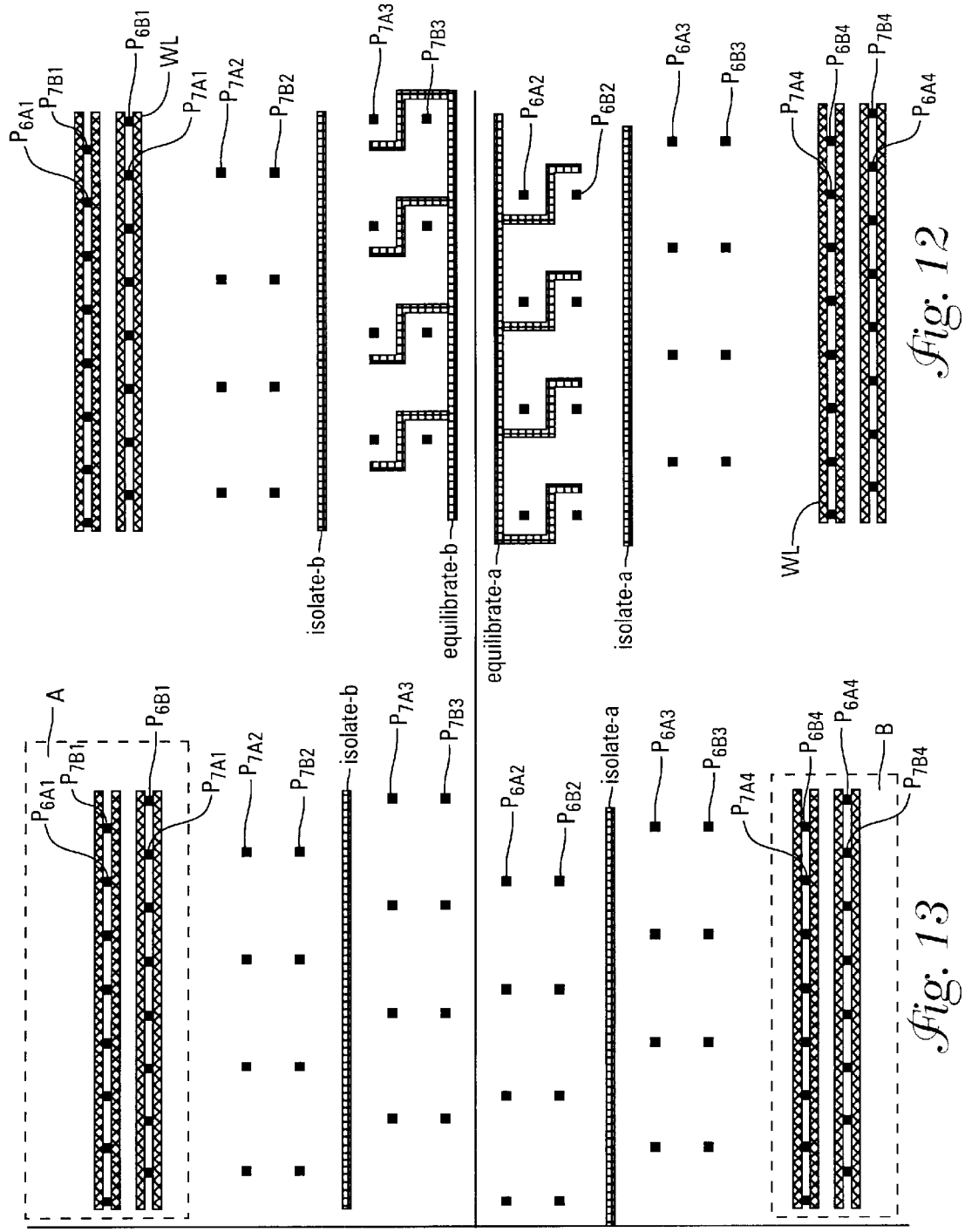

MID ARRAY ISOLATE CIRCUIT LAYOUT

FIELD

The present invention relates to integrated circuit memories and, more particularly, to DRAMs and other such memories that are organized in rows and columns.

BACKGROUND

Of the many different kinds of integrated circuit memories, the dynamic random access memory (DRAM) is the commonest. FIG. 1 shows a block diagram of an early DRAM chip, showing some of the basic architecture. In this drawing, memory array 161 is divided into two parts, A and B, with associated sense amplifiers 162 adjacent the array. Addresses to be accessed are received in the address input buffer 163 and are sent to the row decoder 164 and column decoder 165. Data to be stored is received on the data-in buffer 166, and data to be output is sent to the data-out buffer 167.

At the level of the DRAM array itself, seen in FIG. 2, memory cells are arranged in rows (also called word lines) and columns (bit lines). Each cell can be referenced by its unique word line/bit line address, with each $Cell_{x,y}$ including a storage capacitor $C_{x,y}$ and a pass transistor $T_{x,y}$ to provide access to the capacitor. When the pass transistor is turned on, it connects the capacitor to a bit line, which in turn connects the selected cell in a given column to a sense amplifier. The bit lines are arranged as complementary pairs (commonly referred to as a digit and digit bar pair), and each pair is attached to a p-sense amplifier and an n-sense amplifier (which together are often referred to as simply a sense amplifier). In the array shown, even numbered digit pairs ($BL_{0A}/BL_{0B}$ and $BL_{2A}/BL_{2B}$) would be connected to sense amplifiers at the bottom of the array, while odd numbered digit pairs ($BL_{1A}/BL_{1B}$ and $BL_{3A}/BL_{3B}$) would be connected to sense amplifiers at the top of the array. The p-sense amplifier, seen in FIG. 3, is composed of two cross-coupled p-channel transistors 1410 and 1420. Likewise, an n-sense amplifier, seen in FIG. 4, is composed of cross-coupled n-channel transistors 1310 and 1320. The p-channel and n-channel sense amplifiers together form a bi-stable latch which may be fired or floated by controlling connections to high and low potentials. When the cell is accessed for a read or refresh operation, the sense amplifier amplifies the very weak signal from the cell capacitor to provide a useable output signal, and restore the voltage on the capacitor to its maximum high or low value.

In a precharged state, all word lines are at a low level, keeping all storage capacitors isolated from their respective bit lines by the access transistors. All of the bit lines are held at a level typically midway between the high and low potential and shorted together in pairs by an equilibration circuit (not shown).

In operation, the following events take place sequentially: (a) a word line is taken high, allowing a charge share to take place between the storage capacitors of the selected cells and one of each bit line pair; (b) the sharing of charge from the storage capacitors causes a small change higher or lower in the level of the connected digit, which then is at a different level than the other digit in the digit pair; (c) the sense amplifiers are fired, pulling the lower of the two digits comprising a digit pair to the low potential and the higher digit to the high potential; (d) reads (or writes) may reference (or change) the latched state of the digit pair and sense amplifiers; (e) the word line is returned to the low precharged state; and (f) the sense amplifiers are floated and the digit lines are shorted to their original starting state.

One of the possible sources of errors in a dense memory array is externally received transient signals. Another is cross-coupling: whenever two closely-spaced conductors run in parallel for a significant distance, a certain degree of parasitic coupling will exist between the conductors. To alleviate both of these problems, one common architecture is "twisted" bit lines. This is generally accomplished by taking two adjacent bit line pairs (e.g., $BL_{0A}/BL_{0B}$ and $BL_{1A}/BL_{1B}$) and causing them to cross over each other so that the same bit lines are not adjacent to each other for their entire length. This twisting is evident in FIG. 2.

One inconvenient result of the progress in shrinking memory cells is that the "pitch" of a memory array (i.e., the center-to-center spacing between adjacent columns or adjacent rows) can become too small to contain the needed peripheral circuits. An example of this is seen in the sense amplifiers used to read the cells. Where previously a sense amplifier could be constructed within the width of a bit line pair, the decreasing pitch of shrinking DRAM arrays now means that a sense amplifier needs the width of two bit line pairs for its construction. This is generally handled by putting sense amplifiers at both ends of the array, with one half of the bit line pair being connected to sense amplifiers at a first end of the array, and a second half of the bit line pairs being connected to sense amplifiers at the other end.

As memory cells have continued to shrink, one constraint which becomes more important is parasitic capacitance. As the size of individual cells is reduced, the strength of the electrical signals associated with them is also reduced. At the same time, the number of cells attached to a bit line increases and the length of the bit line itself gets longer, which increases the parasitic capacitance associated with the bit line. With a lower capacitance on the cell and a higher capacitance on the bit line, it takes longer for a useful signal to develop on the line, which slows the response time of the memory, a critical factor. An additional effect of this shrinking capacitance ratio is that the potential difference between digits which the sense amplifier must detect becomes smaller.

One approach which has been tried to reduce bit line capacitance is segmented bit lines. In this approach, the individual cells are not connected to the entire bit line but merely connected to a segment. Segment selection switches connect the appropriate segment for a selected cell to the bit line and to the sense amplifier. However, this approach requires additional area for the segment selection switches and typically also requires an additional layer of metallization.

Another approach is to use isolation gates. U.S. Pat. No. 5,369,622 to McLaury, which is commonly owned by the assignee of this application, explains how an older, single pitched sense amplifier memory can be made to save power by controlling existing isolation devices in a novel manner by isolating unnecessary portions of the bit line during read/write operations. FIG. 5 shows an example of a bit line pair in array $A_x$, such as is shown in this patent. This array contains a single n-sense amplifier for each digit pair, but two p-sense amplifiers at either end of the array $A_x$, each used with either subarray A or subarray B. Although this drawing shows a single bit line, the same layout is repeated across the array. Isolation lines isolate_a and isolate_b selectively isolate the non-selected subarray (and its associated p-sense amplifier) from the n-sense amplifier, which is still connected to the selected subarray and its associated p-sense amplifier. This isolation favorably changes the capacitance ratio between the bit line and the cell being read/written, but since the I/O path is connected to only one end of the bit line, it is necessary to turn on the isolation devices to allow full connection of the bit line to I/O devices. McLaury recognized that if the selected cells were in the subarray which was directly connected to the I/O path, then it was possible to save power by controlling the timing on existing isolation devices so that the subarray which was distant from the I/O is kept isolated when it was not involved in the read/write operation.

However, virtually all DRAM memories are now made with dual pitched sense amplifiers shared between two array blocks. An example of this is seen in FIG. 6. In this drawing, a row of n-sense amplifiers and p-sense amplifiers are placed between two arrays $A_x$, and $A_y$, with n- and p-sense amplifier being shared between a digit pair in $A_x$ and a digit pair in $A_y$. This drawing shows only every other digit pair being connected to the sense amplifiers; each array will have a further row of shared sense amplifiers located at the other end of the bit lines for connection to the remaining digit pairs. Isolation lines isolate_x and isolate_y are used to select which of array blocks $A_x$ or $A_y$ will be active in a given cycle, with no provision being made for isolation lines to separate subarrays. This strategy does not allow the power savings which was afforded by McLaury.

SUMMARY

In one embodiment, a memory array includes a first half and a second half, each half having a number of memory cells accessed by word lines and bit lines. The first half is connected to a number of first half sense amplifiers, and the second half is connected to a number of second half sense amplifiers. Isolation transistors connected between the first and the second halves are controlled to isolate portions of parts of the first half bit lines connected to the second half sense amplifiers when a second half word line is used, and to isolate portions of parts of the second half bit lines connected to the first half sense amplifiers when a first half word line is used.

In another embodiment, a memory device includes a number of even bit lines and a number of odd bit lines, the even bit lines connected to a first set of sense amplifiers on one side of the array and the odd bit lines connected to a second set of sense amplifiers on another side of the array, and a number of first half and second half word lines. A first isolate line and a second isolate line are connected to prevent signal transmission between the first and the second halves on one of the sets of bit lines when a word line is accessed.

In yet another embodiment, a method of reducing power consumption in a memory circuit includes isolating a number of sense amplifiers connected to bit lines of a near subarray and a far subarray from the far subarray, initiating a memory operation using a word line of the near array during isolation of the far subarray.

Other embodiments are described and claimed.

BRIEF DESCRIPTION OF THE DRAWINGS

FIG. 12 is a plan diagram of one embodiment of a poly layout for the embodiment of FIG. 10;

FIG. 13 is a plan diagram of one embodiment of a poly layout for the embodiment of FIG. 11;

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figures 5, 6:
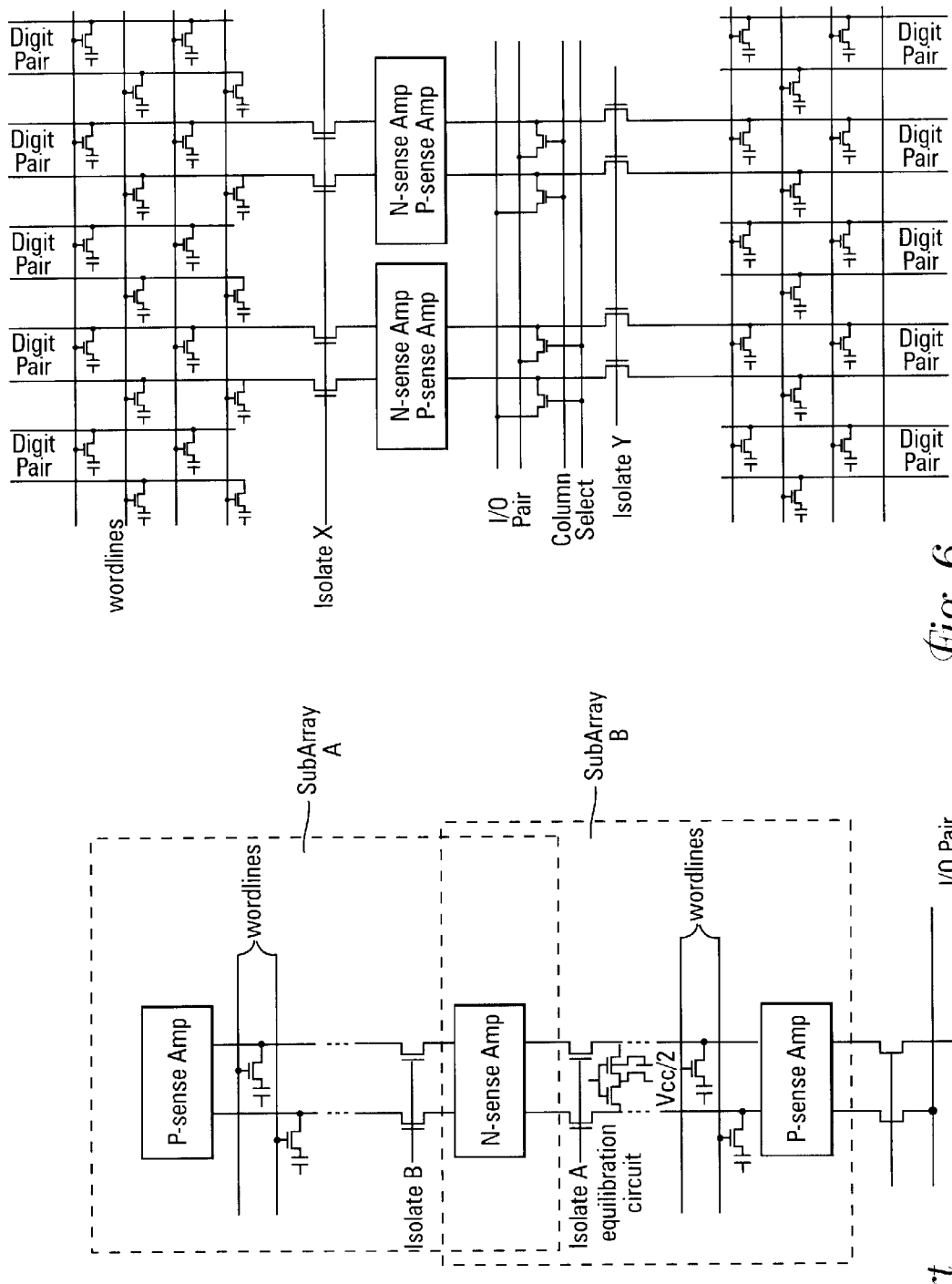
FIG. 5 is a diagram of a DRAM circuit utilizing single pitch sense amplifiers.
FIG. 6 is a diagram of a prior art DRAM circuit utilizing double pitch sense amplifiers.
Figure 7:
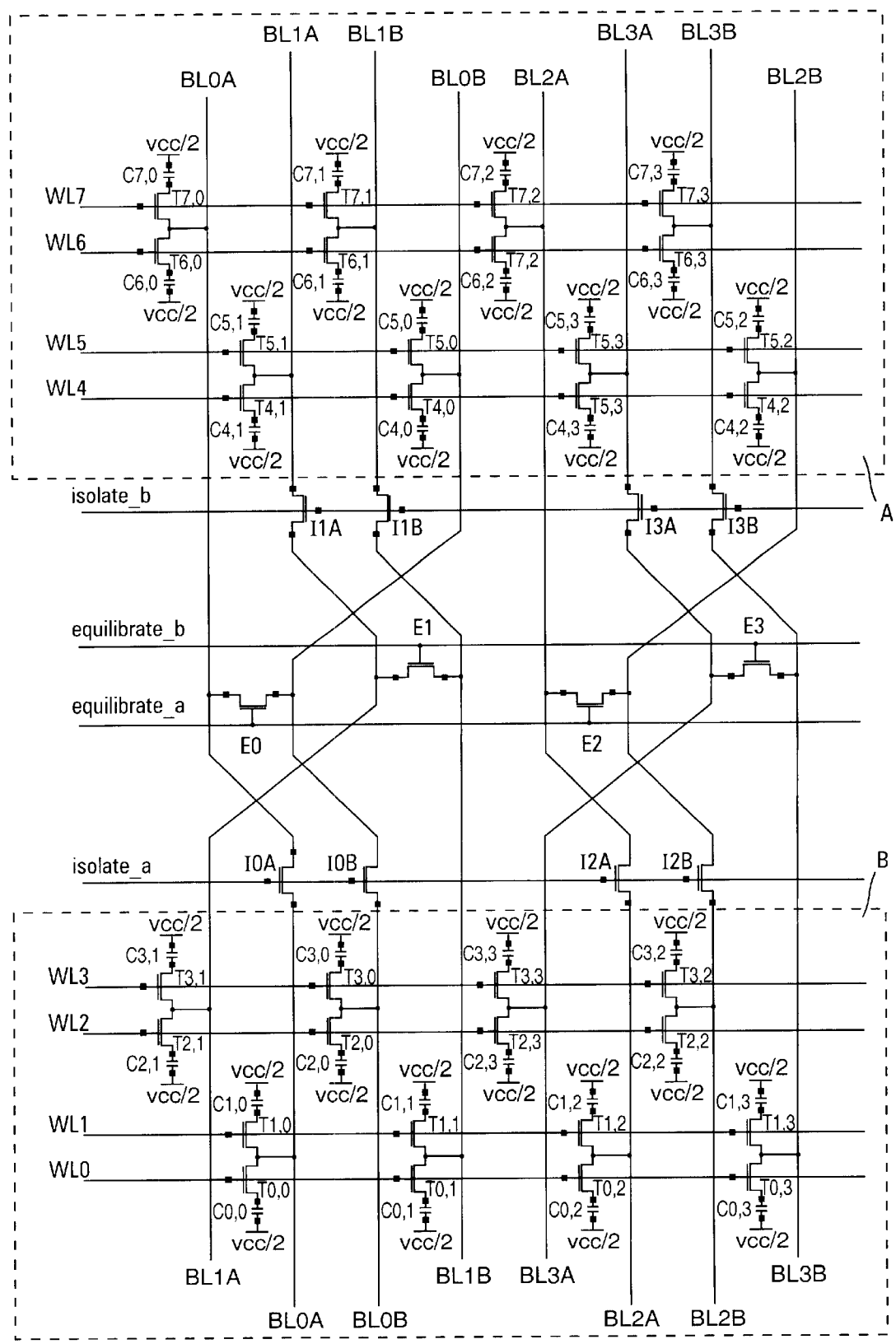
FIG. 7 is a circuit diagram of one embodiment of the present invention.

FIG. 7 is a schematic layout of one embodiment of the disclosed circuit. In this drawing, four word lines ($WL_0$–$WL_3$) are shown as part of a subarray B at the bottom of the page, and four word lines ($WL_4$–$WL_7$) are shown as part of subarray A at the top of the page. Two sets of bit lines are seen, each set having two bit line pairs, and each set exhibiting a bit line twist which is used to cancel capacitive coupling. For example, in this figure, $BL_{0A}$ and $BL_{0B}$ (which together are connected to sense amplifier 0) are twisted with $BL_{1A}$ and $BL_{1B}$ (which are connected to sense amplifier 1). For each bit line pair, there is one cell for each word line, with each cell $Cell_{x,y}$ consisting of a capacitor $C_{x,y}$ and a pass transistor $T_{x,y}$ connected in series between a voltage source ($V_{cc}/2$ in one embodiment) and a respective bit line. As seen in this drawing, cells on two adjacent word lines will typically share a common connection to the bit line. Digit lines which have even numbers are connected to sense amplifiers (not shown) adjacent the lower edge of subarray B, while digit lines which have odd numbers are connected to sense amplifiers (not shown) adjacent the upper edge of subarray A. Like the array seen in FIG. 6, the array of FIG. 7 shares each of its (unseen) sense amplifiers and associated I/O lines with an adjacent array, using isolation circuits to selectively connect the chosen array to the shared sense amplifiers.

The circuitry seen in the central part of FIG. 7, between the two subarrays A and B, includes the portion of the digit lines where the twisting is done, as well as in one embodiment the additional isolation transistors $I_{BL}$ and equilibration transistors $E_{BL}$, which are disclosed herein. Those isolation transistors which isolate portions of subarray A from their respective sense amplifiers are all controlled by control line isolate_a. Likewise, those isolation transistors which isolate portions of subarray B from their respective sense amplifiers are all controlled by control line isolate_b. It is therefore possible again to separate the array into two subarrays and isolate portions of the digit lines within the array.

The isolation transistors $I_{BL}$ are normally on, so that the digit lines within the array are one long conductor, but turning off the isolation transistors will isolate a portion of the digit line from its sense amplifier. Between the two isolation lines are equilibration lines equilibrate_a and equilibrate_b, which control respective ones of transistors $E_{BL}$. The equilibration transistors are normally off, keeping each digit line separate from its digit line pair. When portions of subarray A, for example, are to be isolated, equilibrate_a is turned on, and each of its respective transistors shorts the isolated portions of a digit pair to each other.

Figure 8:
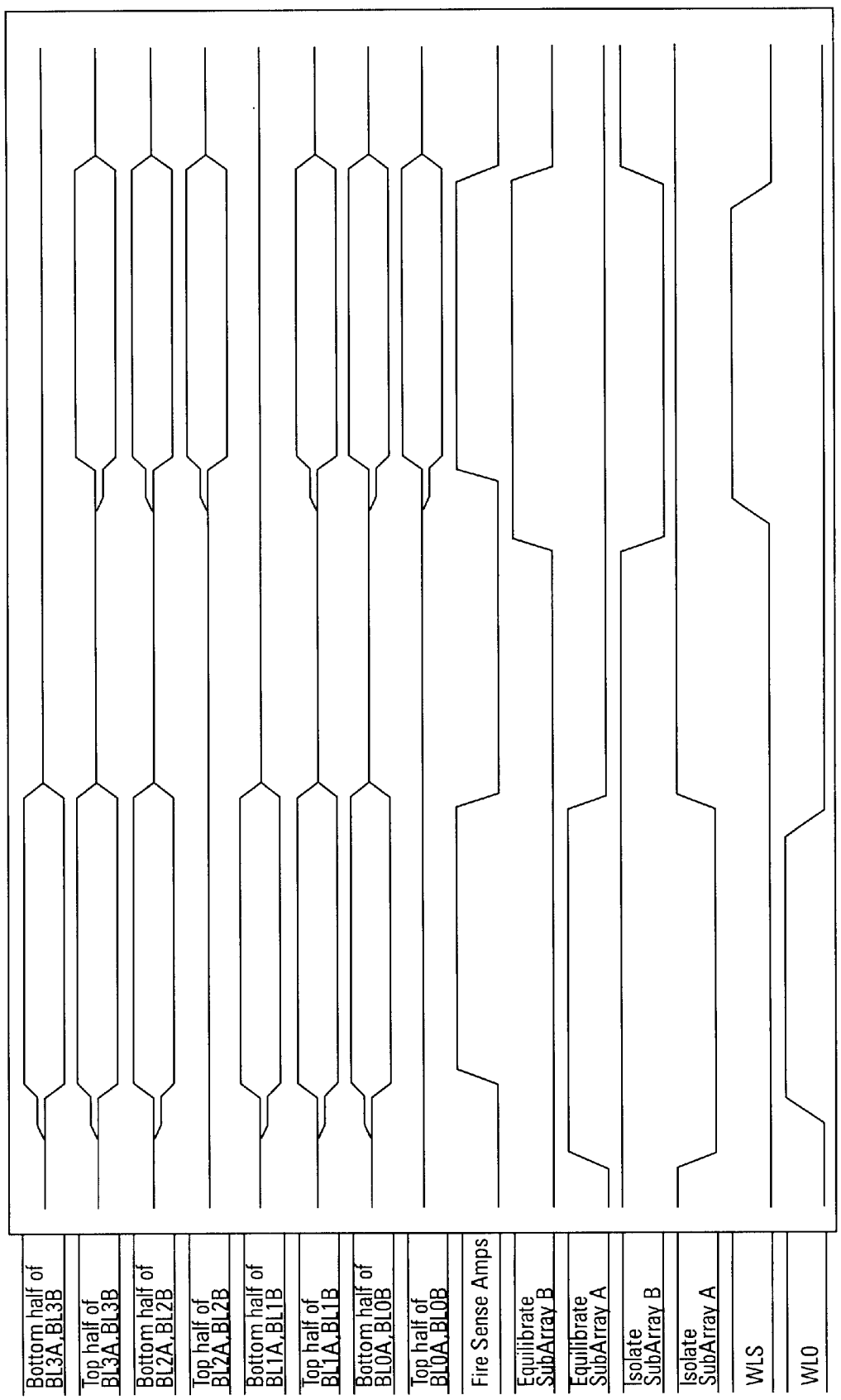
FIG. 8 is a timing diagram of the signals relevant to the circuit of FIG. 7.

FIG. 8 shows a timing diagram for a DRAM access cycle for double pitch sense amplifiers according to the embodiment described above. The left half of the timing chart shows the signals if word line $WL_0$, or any of the word lines in subarray B of FIG. 7, is accessed. In this instance, the bit lines on the lower half of FIG. 7 must all be charged so that the proper transistors can be sensed, and the upper lines which are connected to a sense amplifier must also be charged so that transistors on odd numbered digit lines can be read. However, the upper portions of the even numbered bit lines are not needed, since they will neither be accessed, nor do they provide connection to the sense amplifiers, so they do not need to be charged.

Transistors $I_{0A}$, $I_{0B}$, $I_{2A}$, and $I_{2B}$ controlled by the isolate_a line, which are usually on, are turned off (control signal goes low) to isolate portions of the digit lines in subarray A which are not needed for conduction. This action saves power, since only approximately 75% of the lines normally charged in such an operation are charged. At the same time, transistors $E_0$ and $E_2$, which are controlled by the equilibrate_a line and are usually off, are turned on (control signal goes high) to short isolated portions of the digit lines to each other. This means that in the portion of the array shown in FIG. 7, the portions of bit lines $BL_{0A}/B_{0B}$ and $BL_{2A}/BL_{2B}$ which lie in subarray A are isolated from their respective sense amplifiers, while equilibration transistor $E_0$ is turned on to short the top halves of $BL_{0A}$ and $BL_{0B}$ together, and equilibration transistor $E_2$ is turned on to short $BL_{2A}$ and $BL_{2B}$ together.

It is seen in FIG. 8 that the bit lines are next charged and word line $WL_0$ signal goes high, turning on transistors $T_{0,0}$, $T_{0,1}$, $T_{0,2}$, and $T_{0,3}$. For bit line pairs $BL_{1A}/BL_{1B}$ and $BL_{3A}/BL_{3B}$, both the top and bottom portion of the bit lines reflect a small charge difference, according to the value stored in capacitors $C_{0,1}$ and $C_{0,3}$. For bit line pairs $BL_{0A}/BL_{0B}$ and $BL_{2A}/BL_{2B}$, only the portion of the bit lines which are in subarray B are charged and reflect the value stored in capacitors $C_{0,0}$ and $C_{0,2}$. The portions of these bit lines which lie in subarray A are isolated from the charging/sensing circuitry, by isolation transistors $I_{0A}$, $I_{0B}$, $I_{2A}$, and $I_{2B}$, and their value remains the same. Once the bit lines have attained a separation based on the capacitor value, the sense amplifiers are turned on, increasing the separation reflected by the charged bit lines as described above. Values stored in the capacitors are then output.

On the right-hand side of FIG. 8, the same signals are shown when word line $WL_5$ is read, although this could also be any of the other word lines in subarray A of FIG. 7. In this case, all of the top digit lines are charged, but only the lower digit lines which are connected to the lower sense amplifiers are charged. Hence, isolation transistors $I_{1A}$, $I_{1B}$, $I_{3A}$, and $I_{3B}$, which are connected to the isolate_b line, are turned off (signal goes low), and transistors $E_1$ and $E_3$, connected to the equilibrate_b line, are turned on (signal goes high). When word line $WL_5$ is turned on (signal goes high), transistors $T_{5,0}$, $T_{5,1}$, $T_{5,2}$, and $T_{5,3}$ are turned on. Both the top and bottom portions of bit lines $BL_{0A}/BL_{0B}$ and $BL_{2A}/BL_{2B}$ will reflect the values of respective capacitors $C_{5,0}$ and $C_{5,2}$, and while in bit lines $BL_{1A}/BL_{1B}$ and $BL_{3A}/BL_{3B}$, only the top half of the bit lines are charged and reflect the value of capacitors $C_{5,1}$ and $C_{5,3}$. The bottom portions of bit lines $BL_{1A}/BL_{1B}$ and $BL_{3A}/BL_{3B}$ are isolated and equilibrated, so their value remains the same. After the sense amplifiers are fired, the separation of the charged bit lines is increased to a level that the values read can be output.

Figure 1:
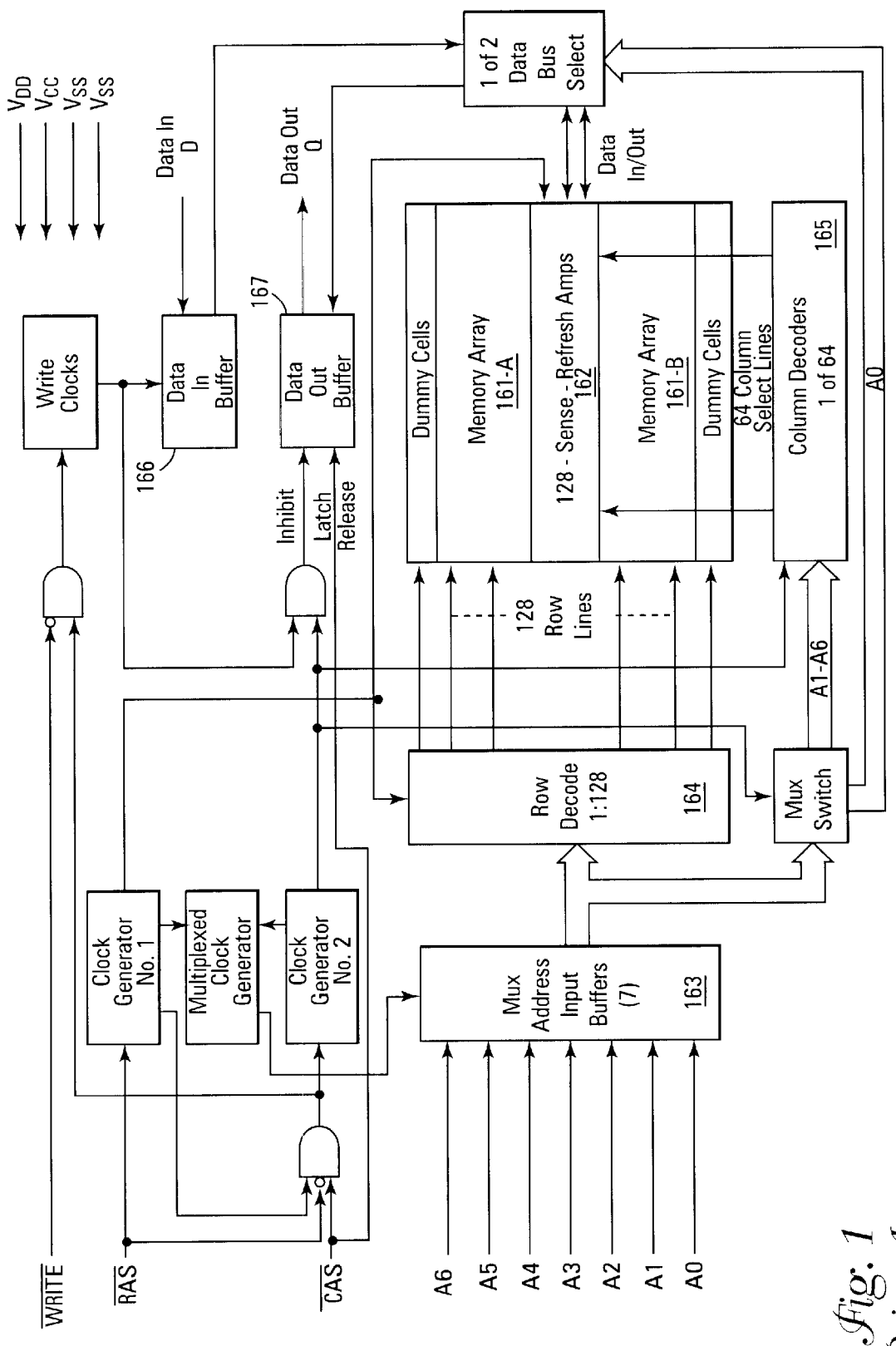
FIG. 1 is a block diagram of the organization of a DRAM chip.
Figure 2:
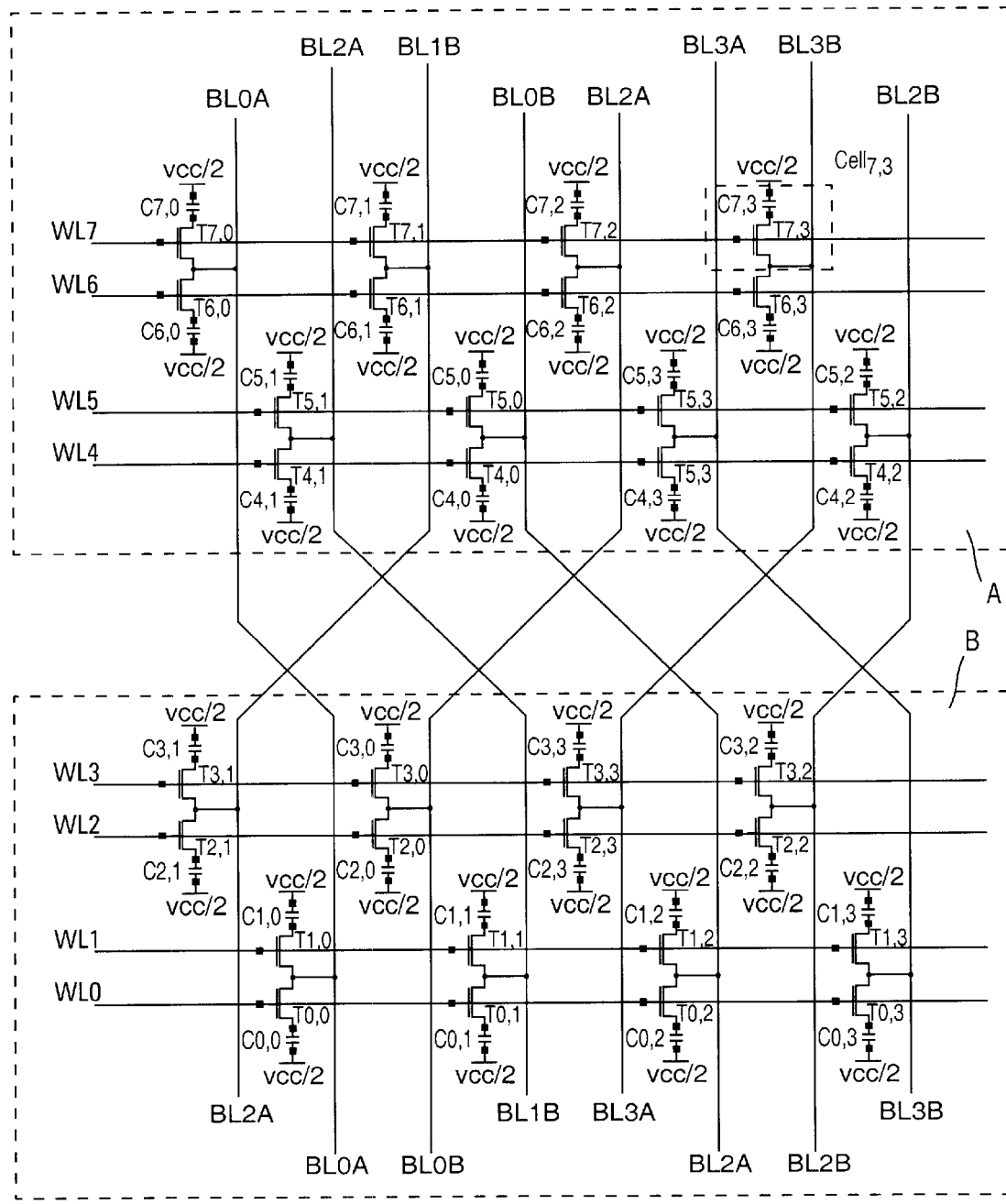
FIG. 2 is a circuit diagram of a prior art circuit.
Figure 3:
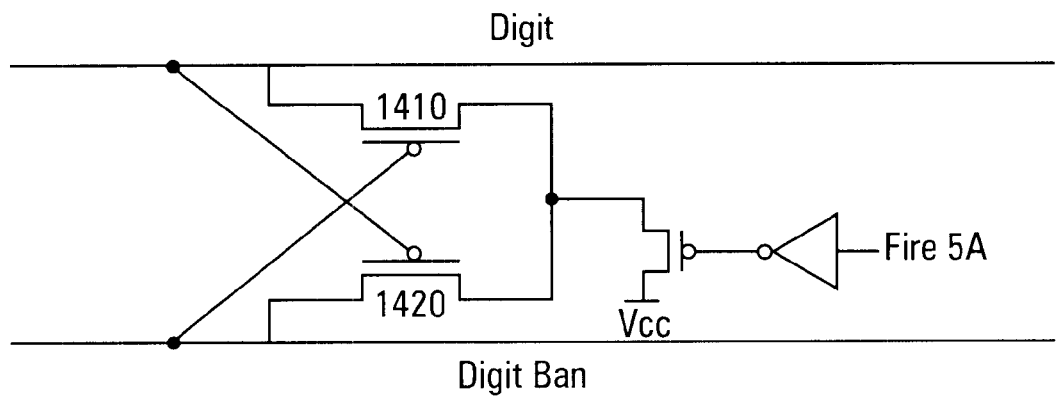
FIG. 3 is a diagram of a p-sense amplifier circuit.
Figure 4:
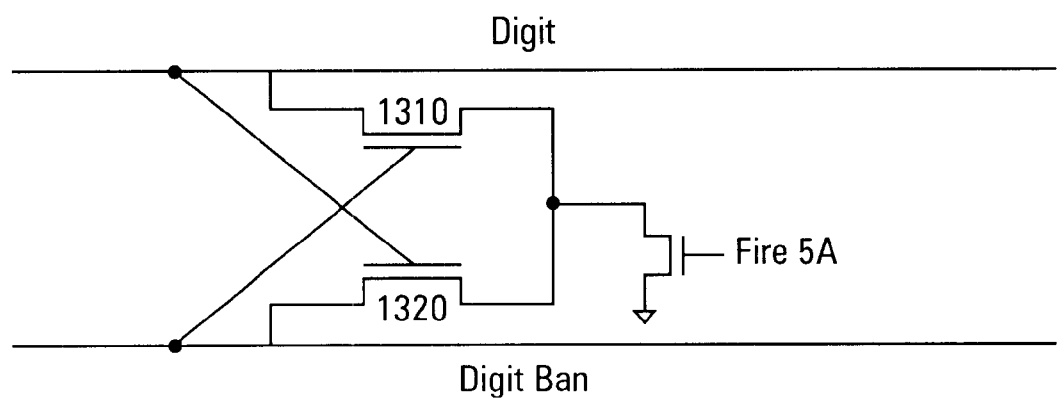
FIG. 4 is a diagram of an n-sense amplifier circuit.
Figure 9:
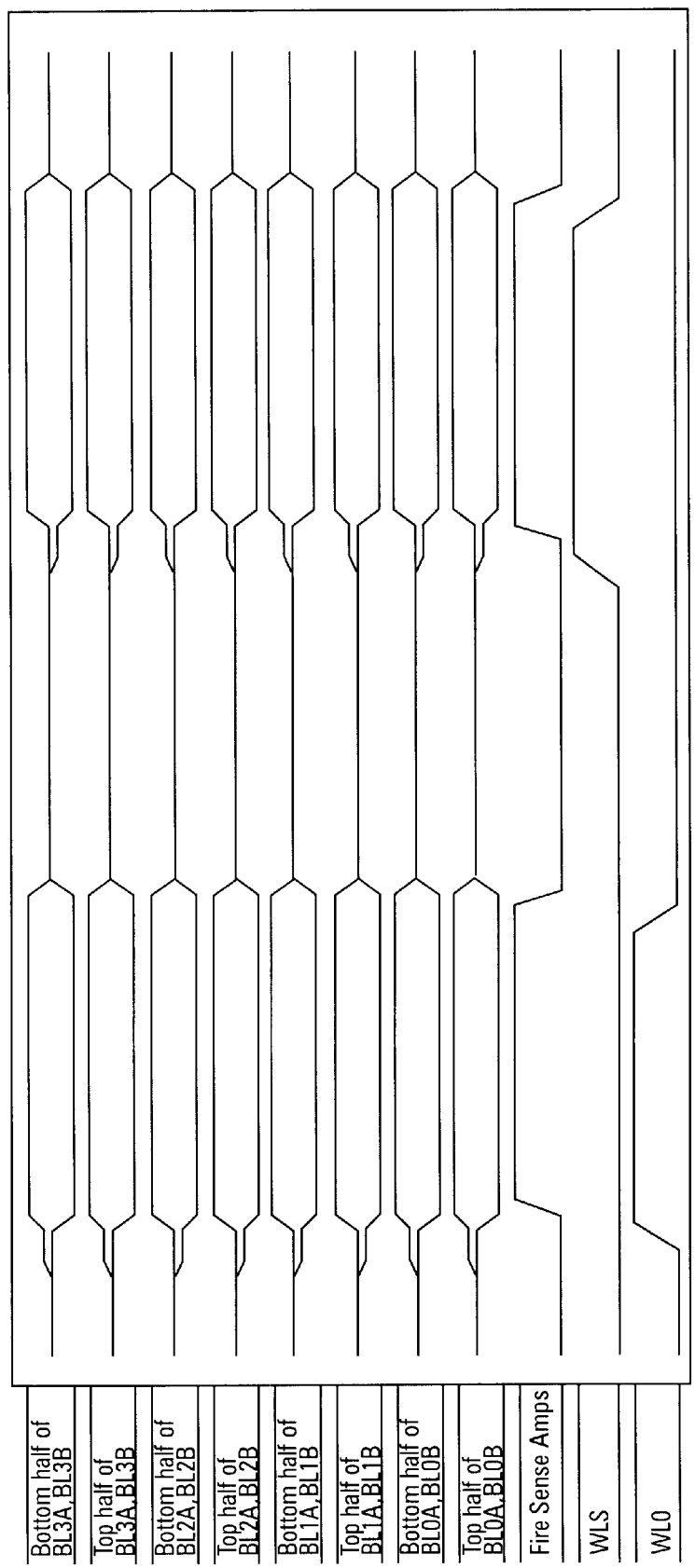
FIG. 9 is a timing diagram of the signals relevant to the circuit of FIG. 2.

The signals shown in FIG. 8 can be contrasted to the signals of FIG. 9, which is a timing diagram for a DRAM access cycle in a prior art circuit using double pitch sense amplifiers without isolation transistors, such as the circuit shown in FIG. 2. In this prior art application, note that all portions of all the bit line pairs are charged for every read. The presently disclosed circuit, by reducing the number of bit line sections which have to be charged, reduces power consumption.

Figures 10, 11:
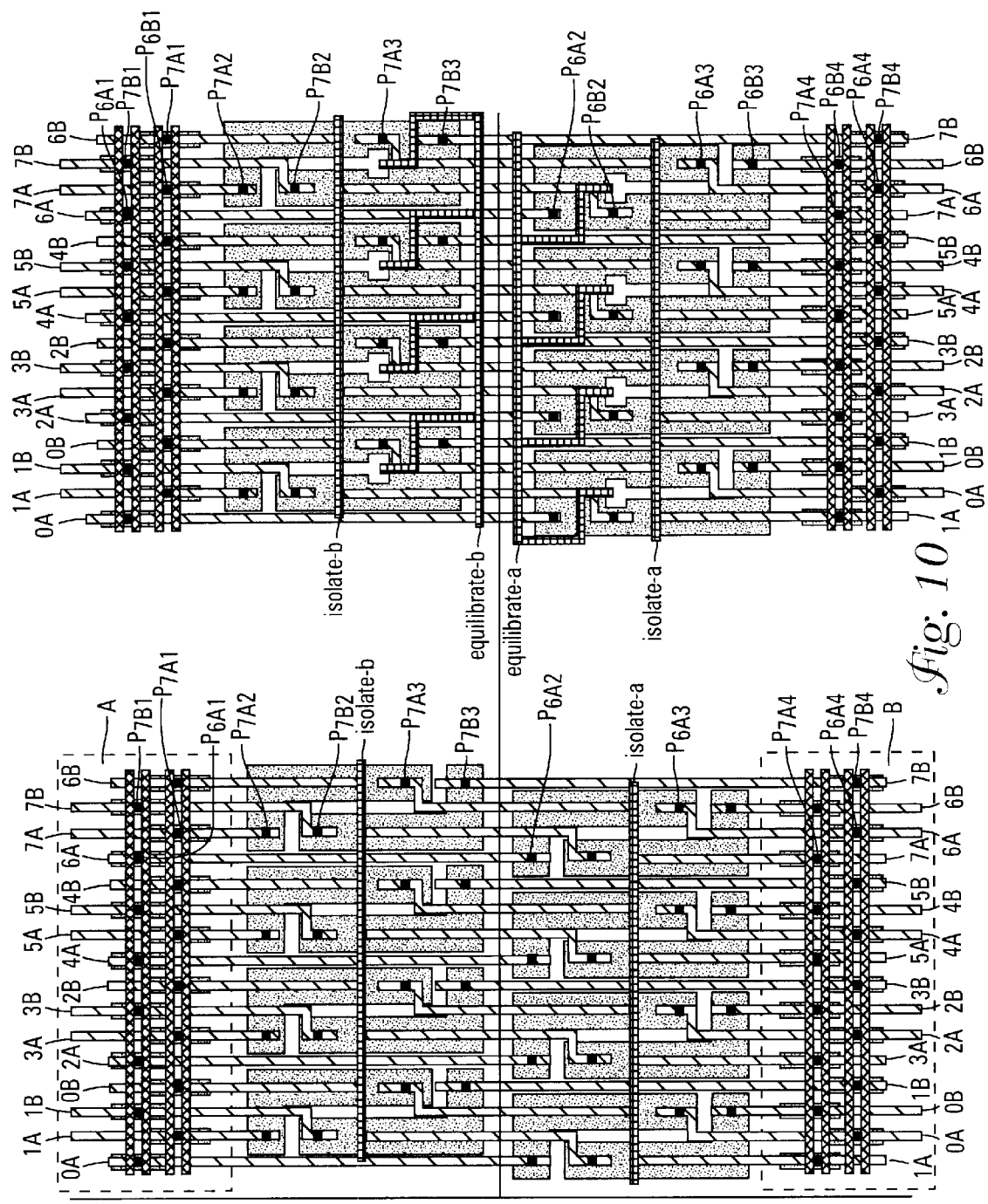
FIG. 10 is a plan diagram of a mask layout of one embodiment of the present invention.
FIG. 11 is a plan diagram of a mask layout of another embodiment of the present invention.
Figures 14, 15:
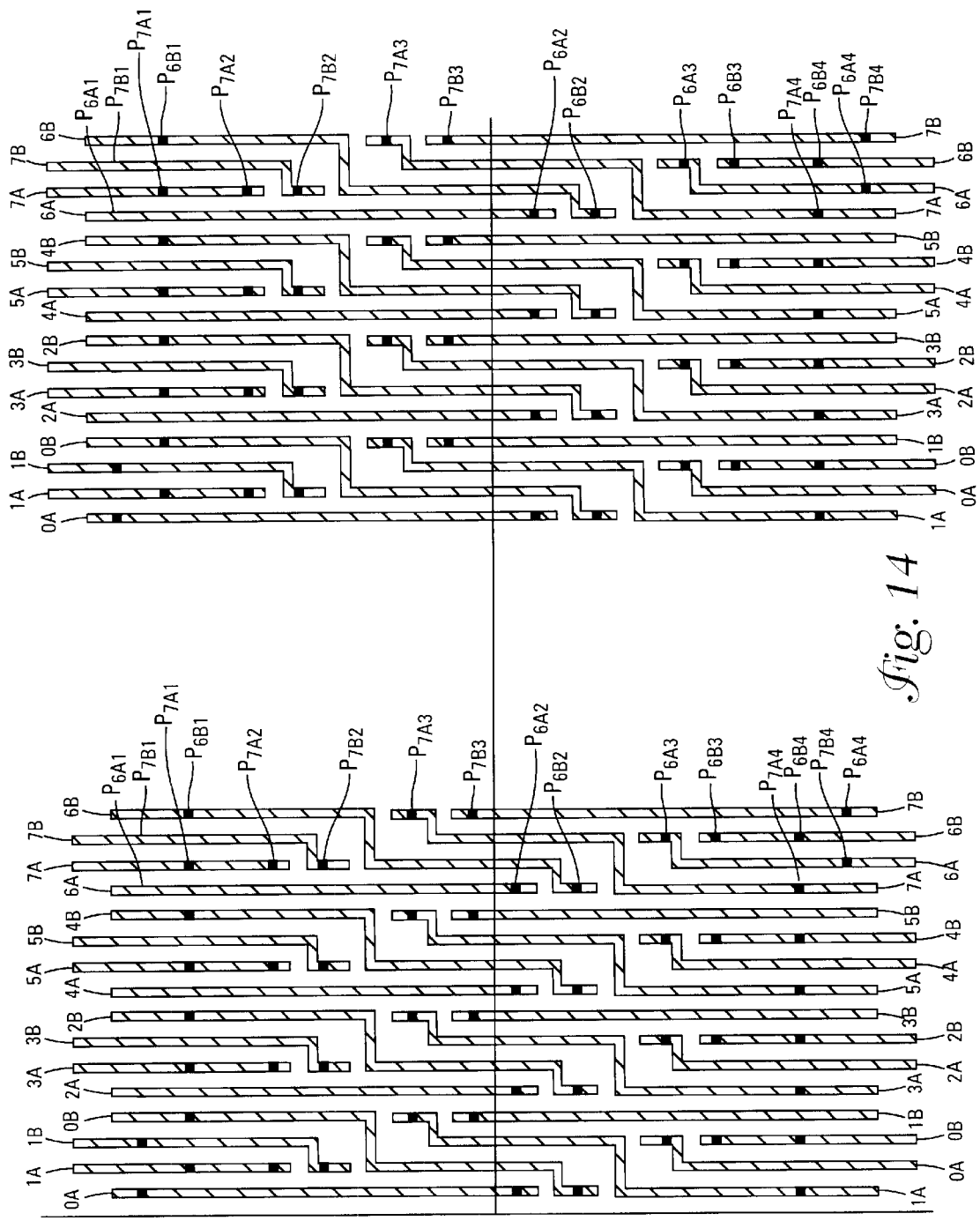
FIG. 14 is a plan diagram of one embodiment of a metal layer for the embodiment of FIG. 10.
FIG. 15 is a plan diagram of one embodiment of a metal layer for the embodiment of FIG. 11.

FIGS. 10 and 11 show the layouts of two disclosed embodiments of the present invention. FIG. 10 is one embodiment of a mask layout for a circuit embodiment in which the twist structure has both isolation devices and equilibration devices. FIG. 11 is a mask layout for a circuit embodiment in which the twist structure has isolation devices, but no equilibration devices. Each of these mask layouts are broken down into three detail masks (FIGS. 12, 14, and 16 correspond to FIG. 10, while FIGS. 13, 15, and 17 correspond to FIG. 11) as explained below, with diffusion areas shown in FIGS. 16 and 17, first metallization level metal-1 in FIGS. 14 and 15, and polysilicon layout in FIGS. 12 and 13. Contacts are shown on each level so that the drawings can be matched up.

Note that FIG. 10 is a layout of the circuit shown in FIG. 7, except that four twisted bit line sets are shown in the current drawings. Subarrays A and B are shown at the top and bottom of the layouts, while the central area shows details of the isolation and equilibration devices, as well as the bit line twists.

Figures 16, 17:
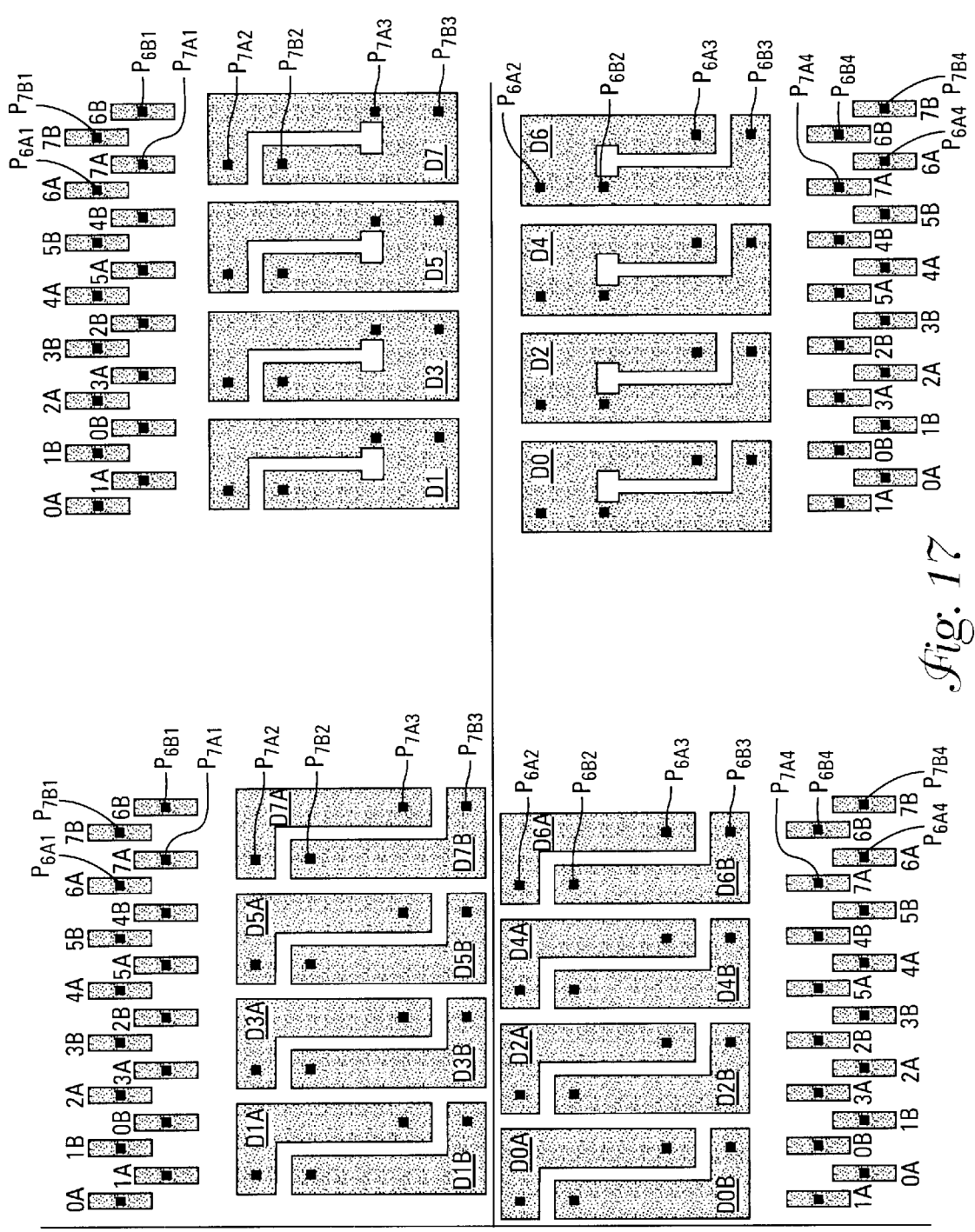
FIG. 16 is a plan diagram of one embodiment of a diffusion layer for the embodiment of FIG. 10.
FIG. 17 is a plan diagram of one embodiment of a diffusion layer for the embodiment of FIG. 11.

FIGS. 16 and 17, respectively, show the diffusion regions $B_{BL}$ when equilibration devices are used and when no equilibration devices are desired. In FIG. 16, diffusion region $D_0$, for example, will carry a portion of bit line $BL_{0A}$ and a portion of bit line $BL_{0B}$. Separation of the two digit lines is accomplished by a transistor, whose gate is formed next. Note that all of the even numbered bit lines will run through the diffusion regions shown at the bottom of the figure, while all the odd numbered bit lines will run through the diffusion regions shown at the top of the figure. This allows all of the odd numbered, or all of the even numbered, bit lines to be "cut" approximately in half by controlling conduction across these regions.

The next layer shown is the polysilicon layers, seen in FIGS. 12 and 13, respectively, for a circuit with and without equilibration devices. In subarrays A and B, the word lines WL are formed, and while in the central device area, isolate_a and isolate_b are formed. Isolate_a and isolate_b form the gate lines for the isolation transistors, $I_{0A}$, $I_{0B}$, $I_{2A}$ and $I_{2B}$, and $I_{1A}$, $I_{1B}$, $I_{3A}$ and $I_{3B}$, respectively, which are created as these lines cross the diffusion areas.

Equilibrate_a (controlling transistors $E_0$ and $E_2$) and equilibrate_b (controlling transistors $E_1$ and $E_3$), if used, are also formed in this step to control equilibrate transistors $E_{BL}$. As mentioned above, these transistors are normally turned off so that each of the digit lines tied thereto is separated from its respective digit bar line. When any of these transistors is turned on, its "A" digit lines are equilibrated with its respective "B" digit lines.

After the polysilicon layers are completed, dielectric is deposited on the chip to provide isolation. Contacts, shown in all layers, are removed, or etched, and filled, e.g., with a metal, then the metal-1 layer is deposited and patterned in the pattern shown in either FIG. 14 or FIG. 15 (the metal-1 layers are substantially similar in the two layouts in one embodiment). In either of these drawings, the bit line pairs which extend beyond the others are the ones connected to a sense amplifier at that end of the array. Of course, these layouts do not show other layers of the chip, such as the capacitor levels, which do not affect the use of the invention. Further, other sense amplifier connections are chosen with other appropriate modifications in different embodiments without departing from the scope of the invention.

To clarify how the devices work, contacts of the rightmost bit pairs (6A and 6B, and 7A and 7B) in each drawing have been labeled, both on the master layout and on each layer, so that connections can more easily be explained. Bit line 6A, for example, runs in the metallization layer from the top of the array through point $P_{6A1}$ (which is a first contact to a DRAM cell) and point $P_{6A2}$ (which is a contact to the diffusion areas $D_6$). Between points $P_{6A2}$ and $P_{6A3}$, the digit line runs through diffusion region $D_{6A}$ in FIG. 17 and $D_6$ in FIG. 16. This allows a section of the digit line to be isolated from its sense amplifier by creating a depletion region beneath isolate_a or isolate_b lines. From contact point $P_{6A3}$, the digit line again runs through the metallization layer and contacts the other half of the DRAM array, represented by point $P_{6A4}$. In a similar manner, by tracing each of the bit lines, it can be seen that both the twist and the isolate functions are accommodated by this layout.

The differences between the circuit of FIG. 10 and FIG. 11 can be seen in FIGS. 12, 13, 16, and 17. By overlaying the figures for these levels, it can be seen that the isolation areas of FIG. 16, plus the depletion areas which are provided in another embodiment by equilibrate_a and equilibrate_b, are similar to the isolation provided by FIG. 17. As mentioned previously, the equilibration transistors are normally off, separating the currents of each bit line from that of its digit pair. However, when a portion of the bit line is isolated, the isolated portions are equilibrated by turning on the respective equilibration transistor to short the digit line to its complement.

The diffusion regions of FIGS. 16 and 17 are suitable for use in forming either enhancement or depletion mode transistors to act as isolation and equilibration devices..

Figure 18:
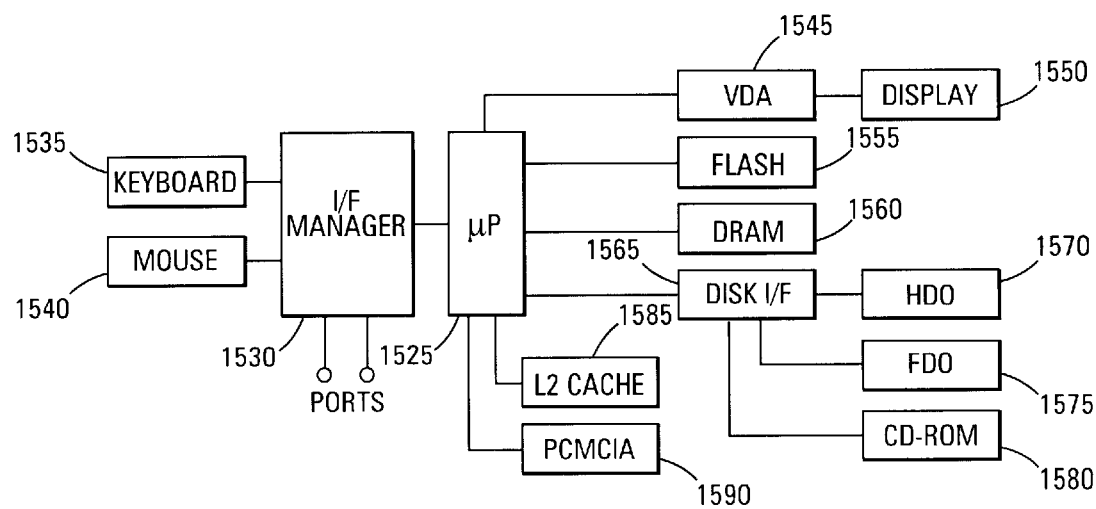
FIG. 18 is a block diagram of a computer system on which embodiments of the present invention are practiced.

FIG. 18 is a block diagram of a computer system which includes DRAM memory. The complete computer system includes, in this example, user input devices (e.g., keyboard 1535 and mouse 1540), microprocessor 1525, which is operatively connected to receive inputs from the input devices through an interface manager chip 1530 (which also provides an interface to the various ports), flash memory 1555 and DRAM 1560, which are accessible by the microprocessor, display 1550 and display driver card 1545, which is connected to output data generated by microprocessor 1525, and a magnetic disk drive 1570 which is read-write accessible through an interface unit 1565 by the microprocessor. Structures such as those embodiments described above are widely usable in such memories and computer systems.

In another embodiment, a complete memory chip includes multiple subarrays, each divided into half-arrays with isolation-cross over structures (or isolation/equilibration/cross over structures in another embodiment) as described above.

In yet another embodiment, the disclosed inventions are used not only in pure memory chips, but are also applicable to chips which integrate memory with other functions.

In still another embodiment, the disclosed inventions are not restricted to double pitch sense amplifiers, but can optionally be adapted to other topologies, including topologies which use one or more column select bits to control column selection at the sense amplifier input.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory array, comprising:
    a plurality of memory cells arranged in rows and columns;
    a plurality of bit lines, each bit line connected to one of the plurality of memory cells and to one of a plurality of sense amplifiers; and
    a separation circuit dividing the plurality of memory cells in two portions, the separation circuit comprising:
        a first plurality of isolation devices connected to a first half of the bit lines to selectively isolate a portion of the first half of the bit lines from their respective sense amplifiers; and
        a second plurality of isolation devices connected to a second half of the bit lines to isolate a portion of the second half of the bit lines from their respective sense amplifiers.

2. The memory array of claim 1, wherein the separation circuit divides the plurality of memory cells substantially in half.

3. A memory array, comprising:
    a plurality of memory cells accessed by row and column decoders and a plurality of bit lines, each of the plurality of bit lines connected to one of a plurality of sense amplifiers; and
    an isolation circuit dividing the memory array substantially into a first half and a second half, the isolation circuit comprising:
        a plurality of isolation transistors, each isolation transistor operatively connected to a bit line to isolate a portion of the bit line.

4. The memory array of claim 3, and further comprising:
    an equilibration circuit connected between the first half and the second half of the memory array, the equilibration circuit to equalize a potential between isolated portions of bit lines.

5. The memory array of claim 3, wherein the plurality of sense amplifiers is divided into a first half and a second half, and wherein the first half of the plurality of sense amplifiers is connected to a first half of the plurality of bit lines and the second half of the plurality of sense amplifiers is connected to the second half of the plurality of bit lines.

6. A memory device, comprising:
a first section and a second section, each section having a plurality of memory cells accessed by word lines and bit lines, wherein each of the bit lines is connected to each of the first and the second section, the first section connected to a plurality of first section sense amplifiers by half of the bit lines, and the second section connected to a plurality of second section sense amplifiers by the other half of the bit lines; and
a plurality of isolation transistors connected between the first and the second sections, a first portion of the plurality of isolation transistors controlled to isolate the first section bit lines connected to the second section sense amplifiers when a second section word line is used, and a second portion of the plurality of isolation transistors controlled to isolate the second section bit lines connected to the first section sense amplifiers when a first section word line is used.

7. The memory device of claim 6, and further comprising:
an equilibrate circuit connected between the first section and the second section to hold isolated bit lines at an equal potential.

8. A memory device, comprising:
a plurality of even bit lines and a plurality of odd bit lines, and a plurality of first half and second half word lines, the word lines and bit lines to access the memory device, the even bit lines connected to a first set of sense amplifiers on one side of an array and the odd bit lines connected to a second set of sense amplifiers on another side of the array; and
a first isolate line and a second isolate line, the first isolate line connected to the plurality of even bit lines to prevent signal transmission between the first and the second sides on the even bit lines when a word line in the first half is accessed, and the second isolate line connected to the plurality of odd bit lines to prevent signal transmission between the second and the first sides on the odd bit lines when a word line in the second half is accessed.

9. A memory array, comprising:
a first set of bit lines having a near section and a far section;
a plurality of sense amplifiers adjacent to the memory array, and electrically connected to the first set of bit lines at each near section;
a second set of bit lines having a near section and a far section;
a second plurality of sense amplifiers adjacent to the memory array, and electrically connected to the second set of bit lines at each near section; and
an isolation circuit connected between the near and the far sections of each of the bit lines, the isolation circuit comprising:
a plurality of isolation devices to isolate from their respective sense amplifier the far portion of one of the sets of bits lines when a word line in the near section is accessed.

10. The memory array of claim 9, wherein the isolation devices are transistors.

11. The memory array of claim 9, and further comprising:
a plurality of equilibrate devices connected to equilibrate a potential between the isolated sections of bit lines.

12. A memory circuit, comprising:
an array of memory cells accessed by a plurality of word lines and even and odd bit lines, the array divided substantially into a first half and a second half;
a first plurality of sense amplifiers adjacent the first half, and connected to the even bit lines;
a second plurality of sense amplifiers adjacent the second half, and connected to the odd bit lines; and
an isolation circuit connected between the first and the second halves to isolate portions of either the odd or the even bit lines when a word line is accessed.

13. The memory circuit of claim 12, wherein the isolation circuit comprises a plurality of isolation transistors, a first subset of the plurality of isolation transistors connected to isolate half of the even bits lines, and a second subset of the plurality of isolation transistors connected to isolate half of the odd bit lines.

14. A memory device, comprising:
a first subarray of memory cells accessed by a first set of word lines and a first set of bit lines;
a second subarray of memory cells accessed by a second set of word lines and a second set of bit lines, the second set of bit lines running through the first and the second subarrays and connected to a first plurality of sense amplifiers, the first set of bit lines running through the first and the second subarrays and connected to a second plurality of sense amplifiers; and
an isolation circuit operatively connected between the first and the second subarray to isolate a section of bit lines in the first or the second subarray from one of the second or the first plurality of sense amplifiers, respectively.

15. The memory device of claim 14, wherein the isolation circuit comprises:
a plurality of isolation transistors, each isolation transistor connected to a bit line.

16. The memory device of claim 15, wherein each isolation transistor connected to one of the first set of bit lines is controlled by a first isolate line.

17. The memory device of claim 16, wherein each isolation transistor connected to one of the second set of bit lines is controlled by a second isolate line.

18. The memory device of claim 14, and further comprising:
an equilibrate circuit operatively connected to equalize a potential between the isolated sections of bit lines.

19. The memory device of claim 18, wherein the equilibrate circuit comprises:
a plurality of equilibrate transistors each connected between a single bit line.

20. The memory device of claim 19, wherein each of the equilibrate transistors connected to one of the first set of bit lines is controlled by a first equilibrate line.

21. The memory device of claim 20, wherein each of the equilibrate transistors connected to one of the second set of bit lines is controlled by a second equilibrate line.

22. A memory device, comprising:
a first subarray of memory cells accessed by a first set of word lines and a first set of bit lines;
a second subarray of memory cells accessed by a second set of word lines and a second set of bit lines, the second set of bit lines running through the first and the second subarrays and connected to a first plurality of sense amplifiers, the first set of bit lines running through the first and the second subarrays and connected to a second plurality of sense amplifiers;
an isolation circuit operatively connected between the first and the second subarray to isolate a section of bit lines in the first or the second subarray from one of the second or the first plurality of sense amplifiers, respectively; and
an equilibrate circuit operatively connected to equalize a potential between the isolated sections of bit lines.

* * * * *